(12) United States Patent
Ichinohe et al.

(10) Patent No.: US 10,211,116 B2
(45) Date of Patent: Feb. 19, 2019

(54) SEMICONDUCTOR DEVICE

(71) Applicant: Mitsubishi Electric Corporation, Tokyo (JP)

(72) Inventors: Hiroaki Ichinohe, Tokyo (JP); Tatsuto Nishihara, Tokyo (JP); Yuji Iwai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/165,084

(22) Filed: May 26, 2016

(65) Prior Publication Data
US 2017/0125316 A1 May 4, 2017

(30) Foreign Application Priority Data
Oct. 29, 2015 (JP) .................. 2015-212974

(51) Int. Cl.
*H01L 23/10* (2006.01)
*H01L 23/36* (2006.01)
(Continued)

(52) U.S. Cl.
CPC .............. *H01L 23/10* (2013.01); *H01L 23/36* (2013.01); *H01L 23/66* (2013.01); *H01L 23/047* (2013.01);
(Continued)

(58) Field of Classification Search
CPC ...... H01L 23/10; H01L 23/043–23/051; H01L 23/36; H01L 23/66; H01L 2924/163;
(Continued)

(56) References Cited

U.S. PATENT DOCUMENTS 4,798,946 A * 1/1989 Fujii ..................... B29C 65/48
235/487
5,311,042 A * 5/1994 Anceau ................. H01L 29/861
257/109
(Continued)

FOREIGN PATENT DOCUMENTS

JP H02-111055 A 4/1990
JP H06-163729 A 6/1994
(Continued)

OTHER PUBLICATIONS

An Office Action; "Notification of Reasons for Refusal," issued by the Japanese Patent Office dated Oct. 2, 2018, which corresponds to Japanese Patent Application No. 2015-212974 and is related to U.S. Appl. No. 15/165,084; with English language translation.
(Continued)

*Primary Examiner* — Victor A Mandala
(74) *Attorney, Agent, or Firm* — Studebaker & Brackett PC

(57) ABSTRACT

A semiconductor device according to the present invention includes a mounting section provided with a chip mounting region for mounting a semiconductor chip, a frame provided in the mounting section so as to surround the chip mounting region, a cap disposed in contact with the frame so as to cover a space surrounded by the chip mounting region and the frame and a joint that joins the frame and the cap outside a contact surface between the frame and the cap.

5 Claims, 3 Drawing Sheets

(51) Int. Cl.
*H01L 23/66* (2006.01)
*H01L 23/047* (2006.01)
*H01L 23/552* (2006.01)
*H01L 23/00* (2006.01)

(52) U.S. Cl.
CPC ............ *H01L 23/552* (2013.01); *H01L 24/29* (2013.01); *H01L 24/32* (2013.01); *H01L 24/48* (2013.01); *H01L 24/73* (2013.01); *H01L 2223/6644* (2013.01); *H01L 2224/291* (2013.01); *H01L 2224/32245* (2013.01); *H01L 2224/48091* (2013.01); *H01L 2224/48227* (2013.01); *H01L 2224/73265* (2013.01); *H01L 2924/15151* (2013.01); *H01L 2924/162* (2013.01); *H01L 2924/163* (2013.01); *H01L 2924/1632* (2013.01); *H01L 2924/16195* (2013.01); *H01L 2924/19107* (2013.01); *H01L 2924/3025* (2013.01)

(58) Field of Classification Search
CPC ............... H01L 2924/162; H01L 24/73; H01L 2924/3025; H01L 2224/48227; H01L 2224/73265; H01L 2224/22; H01L 24/32245; H01L 24/32; H01L 24/48; H01L 2223/6644; H01L 24/29; H01L 2224/291; H01L 2924/19107; H01L 2924/15151; H01L 2924/1632; H01L 2224/48091; H01L 2924/16195; H01L 23/552; H01L 23/047
See application file for complete search history.

(56) References Cited

U.S. PATENT DOCUMENTS

| | | | | |
|---|---|---|---|---|
| 5,311,402 A | * | 5/1994 | Kobayashi | H01L 21/52 174/17.05 |
| 5,905,301 A | * | 5/1999 | Ichikawa | H01L 23/057 257/666 |
| 6,218,730 B1 | | 4/2001 | Toy et al. | |
| 6,321,444 B1 | * | 11/2001 | Yatsuda | H03H 3/08 29/594 |
| 6,515,360 B2 | * | 2/2003 | Matsushima | H01L 23/10 257/704 |
| 8,232,615 B2 | * | 7/2012 | Leclair | B81C 1/00238 257/416 |
| 2002/0190106 A1 | | 12/2002 | Iwai et al. | |
| 2003/0209465 A1 | | 11/2003 | Shoji | |
| 2006/0023431 A1 | | 2/2006 | Wetzel | |
| 2006/0179792 A1 | * | 8/2006 | Shaw | E04F 11/116 52/782.2 |
| 2010/0104887 A1 | | 4/2010 | Yamamoto et al. | |
| 2013/0154085 A1 | * | 6/2013 | Choi | H01L 23/36 257/720 |

FOREIGN PATENT DOCUMENTS

| | | |
|---|---|---|
| JP | H0837248 A * | 2/1996 |
| JP | Hei10-321746 A | 12/1998 |
| JP | 2000-208654 A | 7/2000 |
| JP | 2001-176991 A | 6/2001 |
| JP | 2001-176999 A | 6/2001 |
| JP | 2002-110833 A | 4/2002 |
| JP | 2002-334944 A | 11/2002 |
| JP | 2004-088036 A | 3/2004 |
| JP | 2006-515115 A | 5/2006 |
| JP | 2006-269970 A | 10/2006 |
| JP | 2011-253951 A | 12/2011 |
| WO | 2008/105258 A1 | 9/2008 |

OTHER PUBLICATIONS

An Office Action issued by the Chinese Patent Office (SIPO) dated Oct. 9, 2018, which corresponds to Chinese Patent Application No. 201610960956.5 and is related to U.S. Appl. No. 15/165,084; with English language translation.

* cited by examiner

SEMICONDUCTOR DEVICE

BACKGROUND OF THE INVENTION

Field

The present invention relates to a semiconductor device, and relates to a high frequency module suitable for communication equipment, a satellite and radar.

Background

JP 2001-176999 A discloses a sealed structure of a semiconductor device. In this structure, a frame surrounds a chip mounting region for mounting a semiconductor chip. A flat cap is disposed on a top surface of the frame. The frame and cap are joined together by solder and the semiconductor device is thereby hermetically sealed.

In the semiconductor device shown in JP 2001-176999 A, a cavity which is a hollow structure is formed of the chip mounting region, the frame and the cap. The frame and the cap are joined together and the cavity is thereby hermetically sealed. A joint between the frame and the cap is exposed to the cavity. Therefore, a foreign substance generated from the solder which is a joining member may possibly enter the cavity.

SUMMARY

The present invention has been implemented to solve the above-described problem and it is an object of the present invention to provide a semiconductor device capable of preventing entry of a foreign substance generated from the joint between the frame and the cap.

The features and advantages of t present invention may be summarized as fellows.

According to the present invention, a semiconductor device includes a mounting section provided with a chip mounting region for mounting a semiconductor chip, a frame provided in the mounting section so as to surround the chip mounting region, a cap disposed in contact with the frame so as to cover a space surrounded by the chip mounting region and the frame and a joint that joins the frame and the cap outside a contact surface between the frame and the cap.

Other and further objects, features and advantages of the invention will appear more fully from the following description.

DESCRIPTION OF EMBODIMENTS

Figure 1:
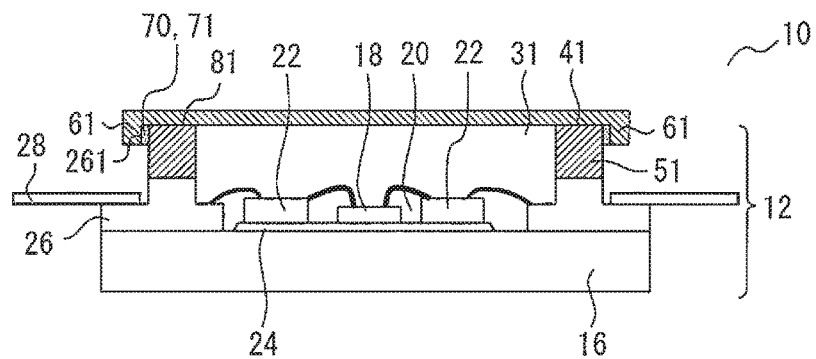
FIG. 1 is a cross-sectional view of a semiconductor device according to a first embodiment of the present invention.

A semiconductor device 10 according to an embodiment of the present invention will be described with reference to the accompanying drawings. The same or corresponding components will be assigned the same reference numerals and duplicate description may be omitted.

First Embodiment

FIG. 1 is a cross-sectional view of a semiconductor device 10 according to the present embodiment. The semiconductor device 10 is provided with a mounting section 12 and a cap 41. The mounting section 12 is provided with a chip mounting region 20 for mounting a semiconductor chip 18 on a top surface of a heat sink 16. The semiconductor chip 18 and a circuit substrate 22 are mounted in the chip mounting region 20 via solder 24. Feedthroughs 26 for transmitting an input/output signal of the semiconductor chip 18 are disposed on both sides of the chip mounting region 20. The semiconductor chip 18 and the circuit substrate 22 are connected to the feedthroughs 26 via a bonding wire. A lead terminal 28 for connecting the semiconductor device 10 with an external circuit is disposed on a top surface of the feedthrough 26.

A frame 51 is provided on the top surface of the feedthrough 26 so as to surround the chip mounting region 20. The cap 41 is disposed on a top surface of the frame 51. A space surrounded by the chip mounting region 20, the frame 51 and the cap 41 forms a cavity 31. The cap 41 is provided with a peripheral portion 61 that is bent toward the mounting section 12 outside the frame 51. The frame 51 and the cap 41 are joined together between an inside face 261 of the peripheral portion 61 and the frame 51. As a result, the cavity 31 is hermetically sealed. A joint 71 between the frame 51 and the cap 41 is formed outside a contact surface 81 between the frame 51 and the cap 41. The joint 71 is formed of a gold-tin alloy 70.

A dielectric provided with a metal or conductive surface is used for the cap 41. This makes it possible to prevent leakage of electromagnetic wave emitted from the semiconductor device 10 and interference by external electromagnetic wave to the semiconductor device 10.

Hereinafter, a method of forming the joint 71 will be described. First, the frame 51 and the cap 41 are plated with gold. A spot of the cap 41 that faces the joint 71 is plated with tin. When the frame 51 is covered with the cap 41, the tin plating of the cap 41 comes into contact with the gold plating of the frame 51. While the tin plate remains in contact with the gold plate of the frame 51, the joint 71 is heated by an oven or reflow. As a result, the gold tin alloy 70 is formed at the joint 71 and hermetic sealing can thereby be realized.

Furthermore, the cap 41 is created using the following procedure. First, an entire surface of a metal plate is plated with nickel and gold. Next, a circumference of the metal plate is plated with tin. Then, press work is applied thereto to form the peripheral portion 61.

High frequency modules used for communication equipment, satellite and radar or the like are required to satisfy high reliability and longevity. Therefore, the semiconductor chip 18 and the circuit substrate 22 need to be protected from temperature, humidity, pollutants and electromagnetic wave. For this reason, the semiconductor chip 18 and the circuit substrate 22 are disposed inside the cavity 31 and hermetically sealed. As means for hermetic sealing, a method is considered whereby the contact surface between the cap and the frame is joined using solder. However, using this method results in a structure in which the joint by solder is exposed to the cavity. In this case, a solder oxide film and melted solder may enter the cavity as foreign substances. In the present embodiment, the joint 71 is isolated from the cavity 31 by the contact surface SI between the frame 51 and the cap 41. Thus, the contact surface 81 prevents the foreign substance generated from the joint 71 from entering the cavity 31.

Furthermore, when hermetic sealing using solder is performed, the solder oxide film needs to be removed to secure stable joining. For this reason, the following scrubbing step is necessary. First, the solder is melted with the solder being held between the cap and the frame. Next, the cap is swung using tweezers or the like to destroy the oxide film of the solder surface. When scrubbing is performed, the melted solder may become granular and scatter into the cavity. Moreover, the solder oxide film may be agglomerated by scrubbing and fall into the cavity. In the present embodiment, the cap 41 and the frame 51 are plated and heated in advance, thus enabling hermetic sealing. This eliminates the necessity for the scrubbing step. This makes it possible to prevent the solder oxide film and the scattered solder from entering the cavity 31.

As described above, according to the present embodiment, the contact surface 81 can prevent a foreign substance from entering the cavity 31. The contact surface 81 further eliminates the necessity for the scrubbing step and can prevent the solder oxide film and the scattered solder from entering the cavity 31. This makes it possible to simplify checking of the presence or absence of a foreign substance in the cavity. When using solder, work needs to be done with the oxygen concentration being kept to a low level to thereby prevent an oxide film from being generated. However, since the present embodiment uses no solder, it is possible to lower the level of oxygen concentration. Therefore, the manufacturing cost can be reduced. In the present embodiment, hermetic sealing is enabled by only covering the frame 51 with the cap 41 and heating that part. Therefore, work becomes easier and it is possible to improve productivity.

Second Embodiment

Figure 2:
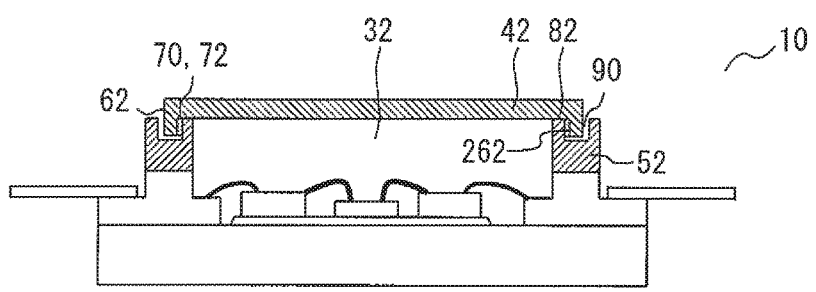
FIG. 2 is a cross-sectional view of a semiconductor device according to a second embodiment of the present invention.

FIG. 2 is a cross-sectional view of the semiconductor device 10 according to the present embodiment. In the present embodiment, the semiconductor device 10 is provided with a frame 52, on a top surface of which a groove 90 is provided. A cap 42 is provided with a peripheral portion 62 that is bent toward an inside of the groove 90. A joint 72 is provided between an inside face 262 of the peripheral portion 62 and the groove 90. A cavity 32 is isolated from the joint 72 by a contact surface 82. Here, when the frame 52 is in contact with the cap 42 on a plurality of planes in a cross-sectional view, a joint is formed opposite to the cavity 32 via the contact surface adjacent to the cavity 32. That is, the frame 52 and the cap 42 are joined together by the joint 72 outside a space (cavity 32) via the contact surface 82 between the frame 52 and the cap 42 adjacent to the cavity 32. An oxide film caused by plating and a gold tin alloy 70 melted by heating during joining may be generated from the joint 72 as foreign substances. In the present embodiment, foreign substances generated from the joint 72 are trapped by the groove 90. For this reason, in addition to the effect shown in the first embodiment, the present embodiment can prevent the outside portion of the frame 52 from being contaminated by the foreign substances.

In the present embodiment, the capacity of the cavity 32 can be changed by adjusting the length of the peripheral portion 62. With a high frequency module, when a resonance frequency of the cavity approximates to an operating frequency band of the high frequency module, a high frequency characteristic may deteriorate. The resonance frequency of the cavity depends on the capacity of the cavity. For this reason, in the present embodiment, the resonance frequency of the cavity 32 can be changed by adjusting the length of the peripheral portion 62. Therefore, it is possible to prevent deterioration of the high frequency characteristic by adjusting the length of the peripheral portion 62.

Third Embodiment

Figure 3:
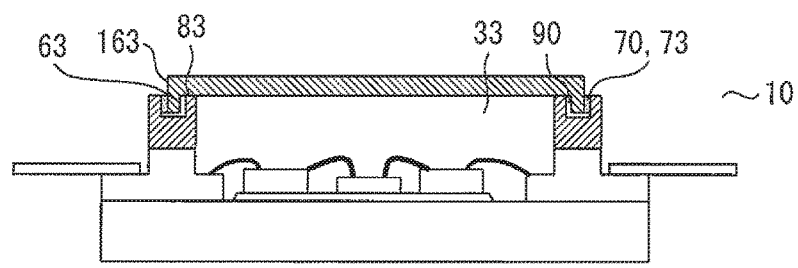
FIG. 3 is a cross-sectional view of a semiconductor device according to a third embodiment of the present invention.

FIG. 3 is a cross-sectional view of the semiconductor device 10 according to the present embodiment. The present embodiment is similar to the second embodiment except in that a joint 73 is provided between an outside surface 163 of a peripheral portion 63 and the groove 90.

In the second embodiment, the joint 72 is isolated from the cavity 32 by the contact surface 82. In contrast, in the present embodiment, the joint 73 is isolated from a cavity 33 by a contact surface 83 and the groove 90. Therefore, compared to the second embodiment, it is possible to further prevent a foreign substance from entering the cavity 33. Furthermore, as in the case of the second embodiment, the capacity of the cavity 33 can be changed by adjusting the length of the peripheral portion 63 in the present embodiment. Therefore, it is possible to prevent deterioration of the high frequency characteristic by adjusting the resonance frequency of the cavity 33.

Fourth Embodiment

Figure 4:
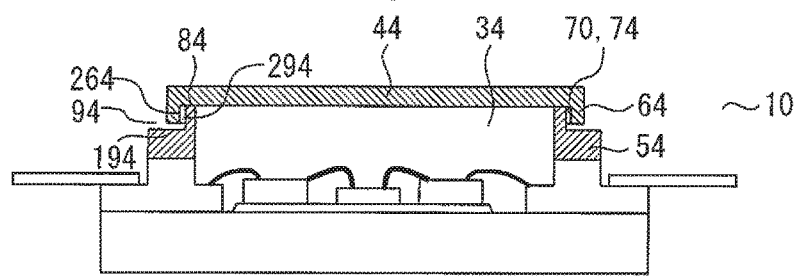
FIG. 4 is a cross-sectional view a semiconductor device according to a forth embodiment of the present invention.

FIG. 4 is a cross-sectional view of the semiconductor device 10 according to the present embodiment. The present embodiment is provided with a frame 54 in which a step 94 is formed. The step 94 becomes narrower toward a top surface of the frame 54. The step 94 is also provided with a bottom surface 194 and a side face 294 outside the frame 54. A cap 44 is provided with a peripheral portion 64 that is bent toward the bottom surface 194. A joint 74 is provided between an inside face 264 of the peripheral portion 64 and the side face 294. A cavity 34 is isolated from the joint 74 by a contact surface 84.

In the present embodiment, a foreign substance generated from the joint 74 is trapped by the bottom surface 194. Thus, in addition to the effect shown in the first embodiment, the present embodiment can prevent contamination of an outside part of the frame 54 by a foreign substance. Furthermore, as in the case of the second embodiment, the present embodiment can change the capacity of the cavity 34 by adjusting the length of the peripheral portion 64. Therefore, it is possible to prevent deterioration of the high frequency characteristic by adjusting the resonance frequency of the cavity 34.

Fifth Embodiment

Figure 5:
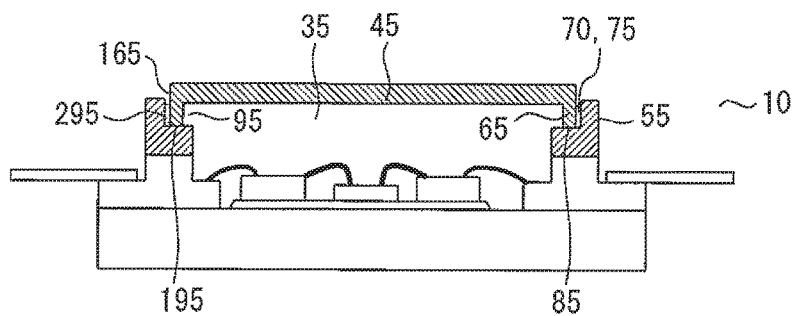
FIG. 5 is a cross-sectional view of a semiconductor device according to a fifth embodiment of the present invention.

FIG. 5 is a cross-sectional view of the semiconductor device 10 according to the present embodiment. The present embodiment is provided with a frame 55 in which a step 95 is formed. The step 95 becomes narrower toward a top surface of the frame 55. The step 95 is provided with a bottom surface 195 and a side face 295 inside the frame 55. A cap 45 is provided with a peripheral portion 65 that is bent toward the bottom surface 195. A joint 75 is provided between an outside surface 165 of the peripheral portion 65 and the side face 295. A cavity 35 is isolated from the joint 75 by a contact surface 85.

In the present embodiment, a foreign substance generated from the joint 75 is trapped by the step 95. Thus, in addition to the effect shown in the first embodiment, it is possible to prevent contamination outside the frame 55 by the foreign substance. As in the case of the second embodiment, the present embodiment can change the capacity of the cavity 35 by adjusting the length of the peripheral portion 65. Therefore, it is possible to prevent deterioration of the high frequency characteristic by adjusting the resonance frequency of the cavity 35. Note that in the present embodiment, when the peripheral portion 65 is extended, it is possible to keep the contact surface 85 that isolates the joint 75 from the cavity 32. This makes it possible to achieve both prevention of entry of a foreign substance into the cavity 35 and an improvement of the high frequency characteristic.

Sixth Embodiment

Figure 6:
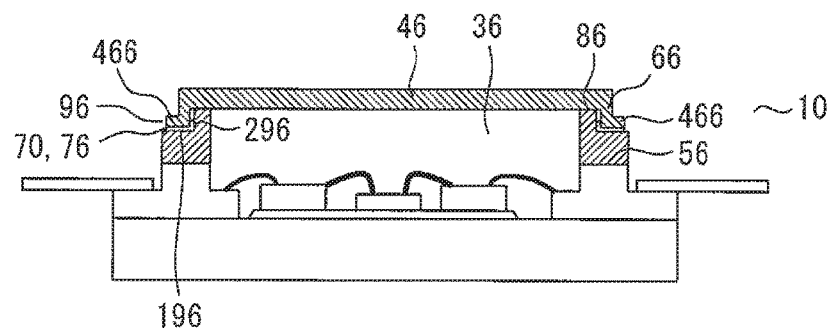
FIG. 6 is a cross-sectional view of a semiconductor device according to a sixth embodiment of the present invention.

FIG. 6 is a cross-sectional view of the semiconductor device 10 according to the present embodiment. The present embodiment is provided with a frame 56 in which a step 96 is formed. The step 96 becomes narrower toward a top surface of the frame 56. The step 96 is provided with a bottom surface 196 and a side face 296 outside the frame 56. A cap 46 is provided with a peripheral portion 66 that is bent toward the bottom surface 196. The peripheral portion 66 is provided with a distal end portion 466 that is further bent outward in a horizontal direction. A joint 76 is provided between the bottom surface 196 and the distal end portion 466. A cavity 36 is isolated from the joint 76 by a contact surface 86.

In the present embodiment, the distal end portion 466 and the bottom surface 196 hold the joint 76 from above and below. Thus, applying a load from above the cap 46 during joining makes it possible to promote the formation of the gold tin alloy 70. Therefore, in addition to the effect shown in the first embodiment, it is possible to further form a light-quality gold tin alloy 70 and improve air tightness. Furthermore, as in the case of the second embodiment, the present embodiment can change the capacity of the cavity 36 by adjusting the length of the peripheral portion 66. Therefore, it is possible to adjust the resonance frequency of the cavity 36 and prevent deterioration of the high frequency characteristic.

Seventh Embodiment

Figure 7:
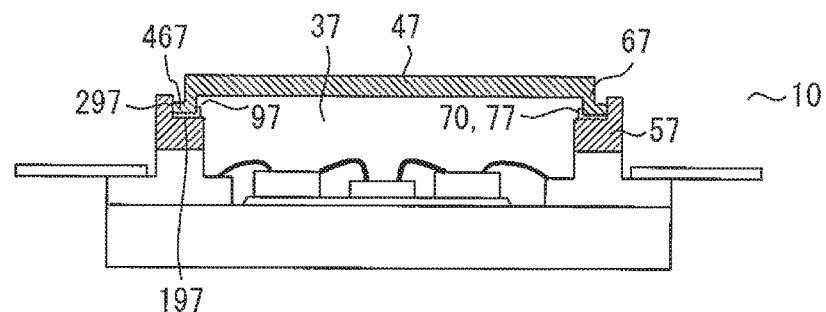
FIG. 7 is a cross-sectional view of a semiconductor device according to a seventh embodiment of the present invention.

FIG. 7 is a cross-sectional view of the semiconductor device 10 according to the present embodiment. The present embodiment is provided with a frame 57 in which a step 97 is formed. The step 97 becomes narrower toward a top surface of the frame 57. The step 97 is provided with a bottom surface 197 and a side face 297 inside the frame 57. A cap 47 is provided with a peripheral portion 67 that is bent toward the bottom surface 197. The peripheral portion 67 is provided with a distal end portion 467 that is further bent outward in a horizontal direction. A joint 77 is provided between the bottom surface 197 and the distal end portion 467.

As in the case of the sixth embodiment, the present embodiment can form a high-quality gold tin alloy 70 and improve air tightness by applying a load from above the cap 47. Furthermore, as in the case of the second embodiment, the present embodiment can change the capacity of a cavity 37 by adjusting the length of the peripheral portion 67. Therefore, it is possible to adjust a resonance frequency of the cavity 37 and prevent deterioration of a high frequency characteristic. Furthermore, in the present embodiment, when a load is applied from above the cap 47, the distal end portion 467 is pressed against the side face 297. This prevents a variation in the capacity of the cavity 37 caused by the peripheral portion 67 expanding outward. Therefore, it is possible to prevent a variation in the resonance frequency of the cavity 37 caused by the variation in the capacity. Thus, it is possible to prevent deterioration of the high frequency characteristic by the variation in the resonance frequency.

Eighth Embodiment

Figure 8:
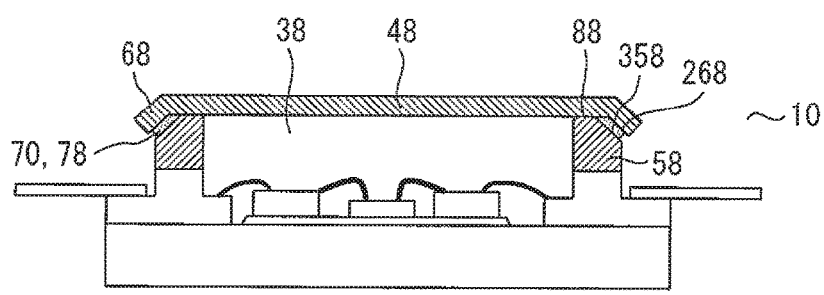
FIG. 8 is a cross-sectional view of a semiconductor device according to a eighth embodiment of the present invention.

FIG. 8 is a cross-sectional view of the semiconductor device 10 according to the present embodiment. The present embodiment is provided with a frame 58. The frame 58 is provided outside with an inclined plane 358 that becomes narrower toward a top surface. A cap 48 is provided with a peripheral portion 68 that is inclined along the inclined plane 358. A joint 78 is provided between an inside face 268 of the peripheral portion 68 and the inclined plane 358. A cavity 38 is isolated from the joint 78 by a contact surface 88.

As in the case of the sixth embodiment, the present embodiment can form a high-quality gold tin alloy 70 by applying a load from above the cap 48. Therefore, in addition to the effect shown in the first embodiment, it is possible to improve air tightness. Furthermore, since the joint 78 is formed along the inclined plane 358, it is possible to provide a wider joint 78 than that of the other embodiments. Therefore, air tightness can be improved.

Obviously many modifications and variations of the present invention are possible in the light of the above teachings. It is therefore to be understood that within the scope of the appended claims the invention may be practiced otherwise than as specifically described.

In the semiconductor device according to the present invention, the joint between the frame and the cap is isolated from the cavity through a contact surface between the frame and the cap. For this reason, the contact surface prevents a foreign substance generated from the joint from entering the cavity.

The invention claimed is:

1. A semiconductor device comprising:
 a mounting section provided with a chip mounting region including a surface for mounting a semiconductor chip, the surface extending in a horizontal direction;
 a frame provided in the mounting section so as to surround the chip mounting region;
 a cap disposed in contact with the frame so as to cover a space surrounded by the chip mounting region and the frame; and
 a joint formed of gold tin alloy that joins the frame to a face of the cap extending in a non-horizontal direction outside a contact surface between the frame and the cap, the entirety of the joint being positioned in the horizontal direction between adjacent sides of the frame and cap, the adjacent sides including only one of an inside face of the frame and an outside face of the frame, wherein
 the inside face of the frame faces in a direction of the space surrounded by the chip mounting region and the frame,
 the outside face of the frame faces away from the space surrounded by the chip mounting region and the frame, and
 a face of the cap opposite to the face of the cap joined to the frame is entirely exposed.

2. The semiconductor device according to claim 1,
wherein the frame comprises a step that becomes narrower toward a top surface and comprises a bottom surface and a side face outside,
the cap comprises a peripheral portion that is bent toward the bottom surface,
the joint is provided between the side face and an inside face of the peripheral portion, and
the inside face of the peripheral portion faces in a direction of the space surrounded by the chip mounting region and the frame.

3. The semiconductor device according to claim 1,
wherein the frame comprises a step that becomes narrower toward a top surface and comprises a bottom surface and a side face inside,
the cap comprises a peripheral portion that is bent toward the bottom surface,
the joint is provided between the side face and an outside surface of the peripheral portion, and
the outside surface of the peripheral portion faces away from the space surrounded by the chip mounting region and the frame.

4. The semiconductor device according to claim 1,
wherein the frame comprises a planar surface inclined from the horizontal direction,
the cap comprises a peripheral portion that is inclined along the planar surface, and
the joint is provided between an inside face of the peripheral portion and the planar surface, and
the inside face of the peripheral portion faces in a direction towards the space surrounded by the chip mounting region and the frame.

5. The semiconductor device according to claim 4, wherein the width of the frame in the horizontal direction becomes narrower toward a top surface of the frame.

* * * * *